(12) United States Patent
Koshihara et al.

(10) Patent No.: US 6,204,514 B1
(45) Date of Patent: *Mar. 20, 2001

(54) ULTRAVIOLET ELECTROLUMINESCENT ELEMENT AND LASER LUMINESCENT ELEMENT

(75) Inventors: Shinya Koshihara, Kanagawa; Kenzo Ebihara, Tokyo; Takashi Miyazawa; Mitsuo Kira, both of Miyagi, all of (JP)

(73) Assignee: The Institute of Physical and Chemical Research, Wako (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/803,089

(22) Filed: Feb. 20, 1997

(30) Foreign Application Priority Data

Feb. 21, 1996 (JP) .................................................. 8-033946
Oct. 2, 1996 (JP) .................................................. 8-262051

(51) Int. Cl.$^7$ ............................... H01L 33/60; H01S 3/16
(52) U.S. Cl. ................................................ 257/40; 372/39
(58) Field of Search .......................... 313/504; 250/365; 257/40, 103; 428/457; 528/310; 372/39, 7

(56) References Cited

U.S. PATENT DOCUMENTS

| | | | |
|---|---|---|---|
| 5,142,343 | * 8/1992 | Hosokawa et al. | 257/103 |
| 5,247,190 | * 9/1993 | Friend et al. | 257/40 |
| 5,366,811 | * 11/1994 | Higashi et al. | 428/457 |
| 5,376,456 | * 12/1994 | Cumming et al. | 428/457 |
| 5,414,069 | * 5/1995 | Cumming et al. | 528/310 |
| 5,710,484 | * 1/1998 | Iwanaga et al. | 313/504 |
| 5,747,930 | * 5/1998 | Utsigi | 313/504 |

FOREIGN PATENT DOCUMENTS 0 633 614     1/1995 (EP).
5-343184 * 12/1993 (JP).

OTHER PUBLICATIONS

Fujii, A. et al., "Ultraviolet Electroluminescent Diode Utilizing Poly (methylphenysilane)," Japanese Journal of Applied Physics, Oct. 15, 1995, pp. L1365–L1367, vol. 34, part 2, No. 10B.

Ebihara, K. et al., "Polysilane–Based Polymer Diodes Emitting Ultraviolet Light," Japanese Journal Applied Physics, Oct. 1, 1996, pp. L1278–L1280, vol. 35, part 1, No. 10A.

Fujii A. et al., "Electroluminescent Diodes Utilizing Polysilanes," Jul. 7, 1996, pp. 3914–3917, Japanese Journal of Applied Physics, vol. 35, part 1, No. 7.

* cited by examiner

Primary Examiner—James W. Davie
(74) Attorney, Agent, or Firm—Pillsbury Madison & Sutro, LLP

(57) ABSTRACT

An EL element and a laser luminescent element are capable of emitting ultraviolet rays with high wavelength purity. The ultraviolet electroluminescent element includes a thin film made from one of a polymer and an oligomer in which the elements, selected from Si, Ge, Sn, and Pb, and directly bonded. The elements selected may be the same as or different from each other. The film is disposed between two electrodes. At least one of the electrodes is transparent. The laser luminescent element includes a thin film made from one of a polymer and an oligomer in which the elements selected from Si, Ge, Sn, and Pb, are directly bonded, and is disposed between two electrodes. The elements may be the same as or different from each other.

6 Claims, 10 Drawing Sheets

FILM FORMATION BY OPTICAL CVD METHOD

FILM FORMATION BY THERMAL CVD METHOD

ULTRAVIOLET ELECTROLUMINESCENT ELEMENT AND LASER LUMINESCENT ELEMENT

BACKGROUND OF THE INVENTION

1. Field of the Invention

The present invention relates to a ultraviolet electroluminescent element and a laser luminescent element capable of emitting in ultraviolet range.

2. Description of Related Art

Electroluminesce (hereinafter referred to as "EL") which is generated by the application of a strong electric field to a fluorescence body has two types. One type is a current injection type EL, such as a light emitting diode. The other is a voltage excitation type EL. As voltage excitation type EL, a dispersion powder type EL panel in which material obtained by dispersing fine fluorescence powder into a synthetic resin or a glass powder is disposed between a transparent electrode and a back electrode, and a double insulation film EL panel in which a film-shaped fluorescent body emitting layer, made by vacuum evaporation or spattering method is completely covered by a dielectric insulating layer, is disposed between a transparent electrode and a back electrode are known. The emitting color of a voltage excitation type EL element varies with fluorescent material. A fluorescent material obtained by adding 0.3 to 0.5 weight percents of manganese to zinc sulfide (ZnS:Mn) provides yellow-orange color; SrS:Ce blue color, CaS:Ce or CaS:Er green color; and CaS:Eu red color. Fluorescent material $ZnS:TmF_3$ provides blue color; $ZnS:TbF_3$ green color; and $ZnS:SmF_3$ orange-red color.

In recent years, an injection type EL element with two layers of a hole transporting layer and an emitting layer has been highlighted. FIG. 11 shows a cross-section of the two-layer EL element in which a hole transporting layer 93 and an emitting layer 94 are mounted on a transparent electrode (ITO) 92, formed on a glass baseplate 91, and an upper electrode 95 is formed thereon. Aromatic diamine derivative or polymethyl phenylsilane is used for the hole transporting layer 93, and 8-hydroxy quinoline aluminum ($Alq_3$), an emitting metal complex, is used for the emitting layer 94. The upper electrode 95 is an electrode in which Mn and Ag are laminated. The hole transporting layer 93 transports holes and blocks electrons, which prevents the electrons from being transported to the electrode without rebonding with the holes.

When the EL element shown in FIG. 11 is operated in continuous direct current mode under the condition of positive ITO and forward bias, a bright green emission color is generated. FIG. 12 shows the emitting spectrum of the EL element and $Alq_3$. In this figure, a solid line shows the spectrum of the EL element and a dotted line shows the spectrum of $Alq_3$. The spectrum of the EL element coincides with that of $Alq_3$, so that the EL is from $Alq_3$ [Polymer Preprints, Japan, 40(3), 1071(1991); Applied Physics Letter, 59(21), 2760].

In a paper "Polymer Preprints" [Polymer Preprints, Japan, 44(3), 325 (1995)] is stated that polysilane with oxygen bridge formation structure emits in an electrical field. According to the paper, polymethyl phenylsilane (PMPS) is painted on an ITO base plate and is bridged under heat, and then single-layer EL element with ITO/bridged PMPS/Al structure to which Al is evaporated emits in the electrical field with emission energy center of 1.8 eV. It is stated, in this paper, that normal polysilane without oxygen bridge formation structure does not emit.

SUMMARY OF THE INVENTION

In optical recording to record data to a recording medium through a ray, recording density can be improved as the recording wave length becomes shorter. Therefore, it is advantageous to use a small light source which emits in the ultraviolet range. Further, since many fluorescent pigments emit fluorescence while absorbing ultraviolet rays, if an ultraviolet plane light source is realized, it becomes possible to form a display panel by applying fluorescent pigments thereon. In an optical system using ultraviolet rays, if the emitting wave length purity of an ultraviolet ray source is high, it would become easy to design diffraction gratings and mirrors adopted to the system. Demand for such an ultraviolet ray source is strong.

An EL element with an emission spectrum in the visible range is already known as described above. However, no EL element emitting in the ultraviolet range is known. Besides, a conventional EL element is, as illustrated in FIG. 12, provided with a broad emission spectrum.

It is therefore an object of the present invention to provide an EL element capable of emitting ultraviolet rays with high wave length purity.

It is another object of the present invention to provide a solid laser luminescent element capable of emitting in a range that includes the ultraviolet range.

In the present invention, a thin film made from a polymer or an oligomer, which is formed by directly bonding elements selected from Si, Ge, Sn, and Pb (those elements may be the same as or different from each other) and used as an emission layer of an EL element or a laser luminescent element, accomplishes the above-mentioned objects. In order to cause the EL element or the laser luminescent element to emit efficiently, the polymer or oligomer needs to have six or more atoms in a main chain structure.

That is, the EL element or the laser luminescent element, according to the present invention, includes a thin film made from a polymer or an oligomer formed by directly bonding elements selected from Si, Ge, Sn, and Pb (those elements may be the same with each other or may be different from each other) and disposed between two electrodes. At least one of the electrodes is transparent. In the laser luminescent element, however, it is not always necessary for one of the electrodes to be transparent.

As a polymer or an oligomer in which elements selected from Si, Ge, Sn, and Pb are directly bonded (those elements may be the same as or different from each other), chemical formula 1 may be used as follows:

polymer or oligomer in which elements selected from Si, Ge, Sn, and Pb are the same as each other, and the elements are directly bonded, or chemical formula 2 may be used as follows:

polymer or oligomer in which elements selected from Si, Ge, Sn, and Pb are different from each other, and the elements are directly bonded.

[Chemical formula 1]

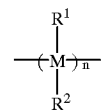

Here, M represents Si, Ge, Sn, or Pb, and $R^1$ and $R^2$ represent substituents of the aforementioned elements. Both of them may be the same as or different from each other.

Alkyl group, allyl group, phenoxy group, alkoxyl group, alkylamino group, alkylthio group, alcoholic hydroxy group or the like may be selected as $R^1$ and $R^2$. However, they are not limited to the above-mentioned groups.

[Chemical formula 2]

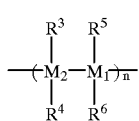

Here, $M_1$ and $M_2$ represent Si, Ge, Sn, or Pb, and $R^3$, $R^4$, $R^5$, and $R^6$ represent substituents of the aforementioned elements. Both of them may be the same as or different from each other. Alkyl group, allyl group, phenoxy group, alkoxyl group, alkylamino group, alkylthio group, alcoholic hydroxy group or the like may be selected as $R^1$ and $R^2$. However, they are not limited to the above-mentioned groups.

A polymer of any one of the four kinds of 14th group elements Si, Ge, Sn, and Pb basically has the same physical properties. So that it is possible to obtain an EL element and a laser luminescent element with an emission spectrum in the ultraviolet range from a polymer or an oligomer in which the above-mentioned elements are exchanged with each other. Since this kind of EL element has a narrow emission band, it is possible to produce EL elements and laser luminescent elements with different emission wave lengths by changing the kinds of 14th family elements or the sequence of elements.

It is known that the photoelectronic property of a polymer or an oligomer formed by directly bonding elements selected from Si, Ge, Sn, and Pb (those elements may be the same as or different from each other) strongly depends on the structure of the main chain. It is possible to control, more or less, the main chain structure through a substituent. Therefore, the selection of the substituent permits the property as an EL element or a laser luminescent element to be changed. From this point of view, it is possible to use, as an emission layer, for example, a thin film made from a polymer or an oligomer in which the main chain structure is structurally controlled, that is, comformationally controlled to be suitable for an emission condition, as indicated by chemical formulas 3 and 4. A polymer or an oligomer in the chemical formula 3 solidly draws a spiral. The conformation thereof is relatively fixed at room temperature. A polymer or an oligomer in the chemical formula 4 corresponds to those in which neighboring $R^1$ or $R^2$, or both, constitute an alkyl group in combination with each other in chemical formula 1. The conformation thereof is relatively fixed at room temperature also. In order to increase the mechanical strength of a polymer or an oligomer, it may be possible to adopt a structure in which reinforcing substituents, such as alkyl chains, are added for bridging at some places.

[Chemical formula 3]

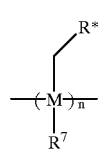

Here, M represents Si, Ge, Sn, or Pb, and R* represents an optically active substituent. 2-methyl butyl group may be used as an optically active substituent. $R^7$ represents substituents of the above-mentioned elements. They may be the same as or different from each other. Alkyl group, allyl group, phenoxy group, alkoxyl group, alkylamino group, alkylthio group, alcoholic hydroxy group or the like may be selected as $R^7$. However, it is not limited to the above-mentioned groups.

[Chemical formula 4]

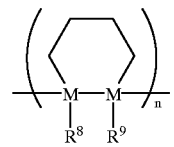

Here, M represents Si, Ge, Sn, or Pb, and $R^8$ and $R^9$ represent substituents of the above-mentioned elements. They may be the same as or different from each other. Alkyl group, allyl group, phenoxy group, alkoxyl group, alkylamino group, alkylthio group, alcoholic hydroxy group or like may be selected as $R^8$ and $R^9$. However, they are not limited to the above-mentioned groups.

Further, as indicated in the next chemical formula 5, it is possible to use a polymer or an oligomer in which the same kind of 14th family elements with only one substituent are directly bonded.

[Chemical formula 5]

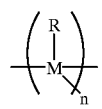

Here, M represents Si, Ge, Sn, or Pb, and R represents substituents of the above-mentioned element. They may be the same as or different from each other. Alkyl group, allyl group, phenoxy group, alkoxyl group, alkylamino group, alkylthio group, alcoholic hydroxy group or the like may be selected as R. However, it is not limited to the above-mentioned groups.

Conventional methods such as spin coating, vacuum evaporation, optical CVD, thermal CVD, and MBE (molecular beam epitaxy) may be used to form an emission layer film. When an emission layer is formed directly on the silica glass base plate by the CVD method, it is advantageous to use a silica glass base plate with silane-treated surface.

With a polymer or an oligomer, which is used as an emission layer in the present invention, it is possible to control the emission wave length by changing the number of atoms of Si, Ge, Sn, and Pb, which form the main structure. Generally, as chain length of the polymer or oligomer becomes longer, the peak wave length shifts on the long wave length side.

A polysilane layer of a conventional EL element only functions as a hole transporting layer. On the other hand, in the present invention, emission of polysilane itself is used to provide an ultraviolet electroluminescent element not previously developed.

BRIEF DESCRIPTION OF THE DRAWINGS

The present invention will be more apparent from the ensuring description with reference to the accompanying drawings wherein.

DETAILED DESCRIPTION OF PREFERRED EMBODIMENTS

Now, embodiments of the present invention will be explained. Here, the explanation will be made in relation to a polymer or an oligomer in which Si elements are directly bonded, as an example.

Figure 1:
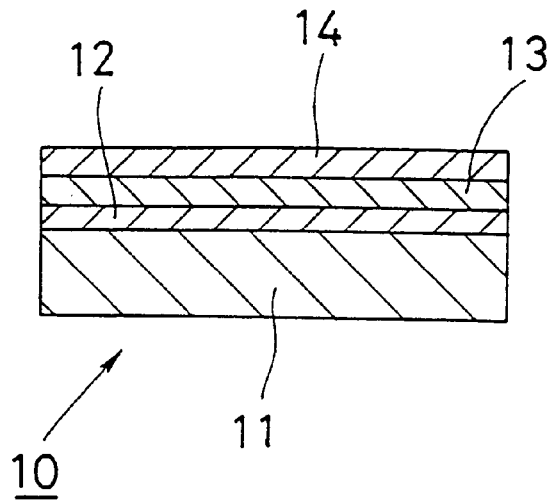
FIG. 1 is a schematic cross-sectional view of an EL element according to the present invention.

An EL element with an emission layer of polydi-n-hexyl polysilylene (PDHS:—SiRR'—:R=R'=$C_6H_{13}$) was produced. A schematic cross section is illustrated in FIG. 1. The element was produced by the following method.

4.5 g of sodium was solved in 50 ml of n-octane which was treated by sulfuric acid and was deaerated, and 0.5 g of 18-crown-6 ethel was added thereto to prepare n-octane solution. To the solution was dropped 50 ml of n-octane solution containing 10 g of dihexyl dichlorosilane as raw material, and the solution was stirred at 100° C. all night. After sodium chloride as a secondary product of the reaction was removed through filtration, the filtrate was washed with water and was dried with calcium chloride. Then, the solvent was evaporated to obtain a waxy coarse polymer (poly-di-n-hexyl polysilylene). The coarse polymer was solved in toluene and was reprecipitated with ethanole. The polymer produced through reprecipitation was dried under $10^{-5}$ Torr vacuum at 70° C. all night to produce poly-di-n-hexyl polysilylene (PDHS:SiRR'—;R=R'=$C_6H_{13}$). The molecular weight of the PDHS produced, which was measured by gel permeation liquid chromatography, was approximately 300,000, when calculated in terms of polystyrene.

Figure 12:
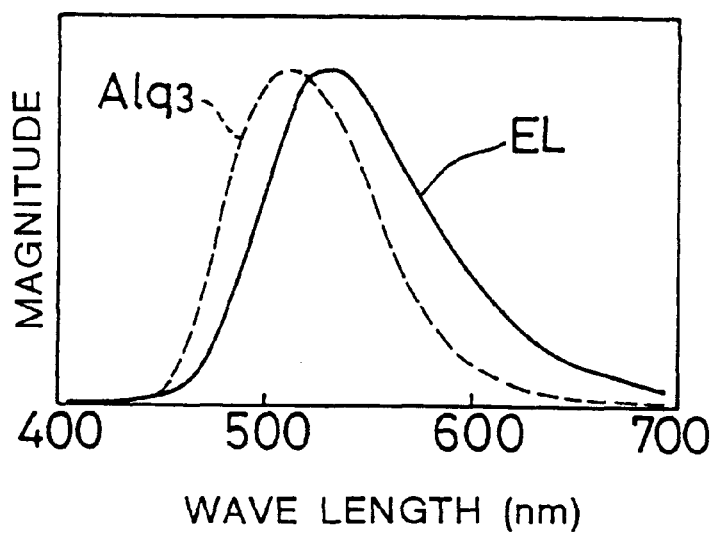
FIG. 12 is a graph indicating emission spectrum of a conventional EL element and that of $Alq_3$.

The PDHS, which was produced by the above steps, was solved in toluene, and was spin-coated on the silica glass base plate 11 on which ITO film was coated as the transparent electrode 12 to form thin film of PDHS as an emitting layer 13. The thickness of the PDHS film produced was 0.1.m to 1.m. Further, 50 nm to 100 nm of aluminum as the upper electrode 14 was evaporated on the thin film of PDHS to produce the EL element 10. As material for the above-mentioned electrode, other than aluminum, magnesium or calcium may be used. The manufactured EL element 10 was cooled at 77 K through liquid Nitrogen and was connected to dc power source 21, as illustrated in FIG. 12. A beam emitted from the EL element 10 was collected by a collection lens 24 and was introduced to a spectrometer 25 for spectrum analysis. Then, the beam was detected by a detector 26 to measure an emission spectrum, which indicates sharp electric field emission in the ultraviolet range.

Figure 3:
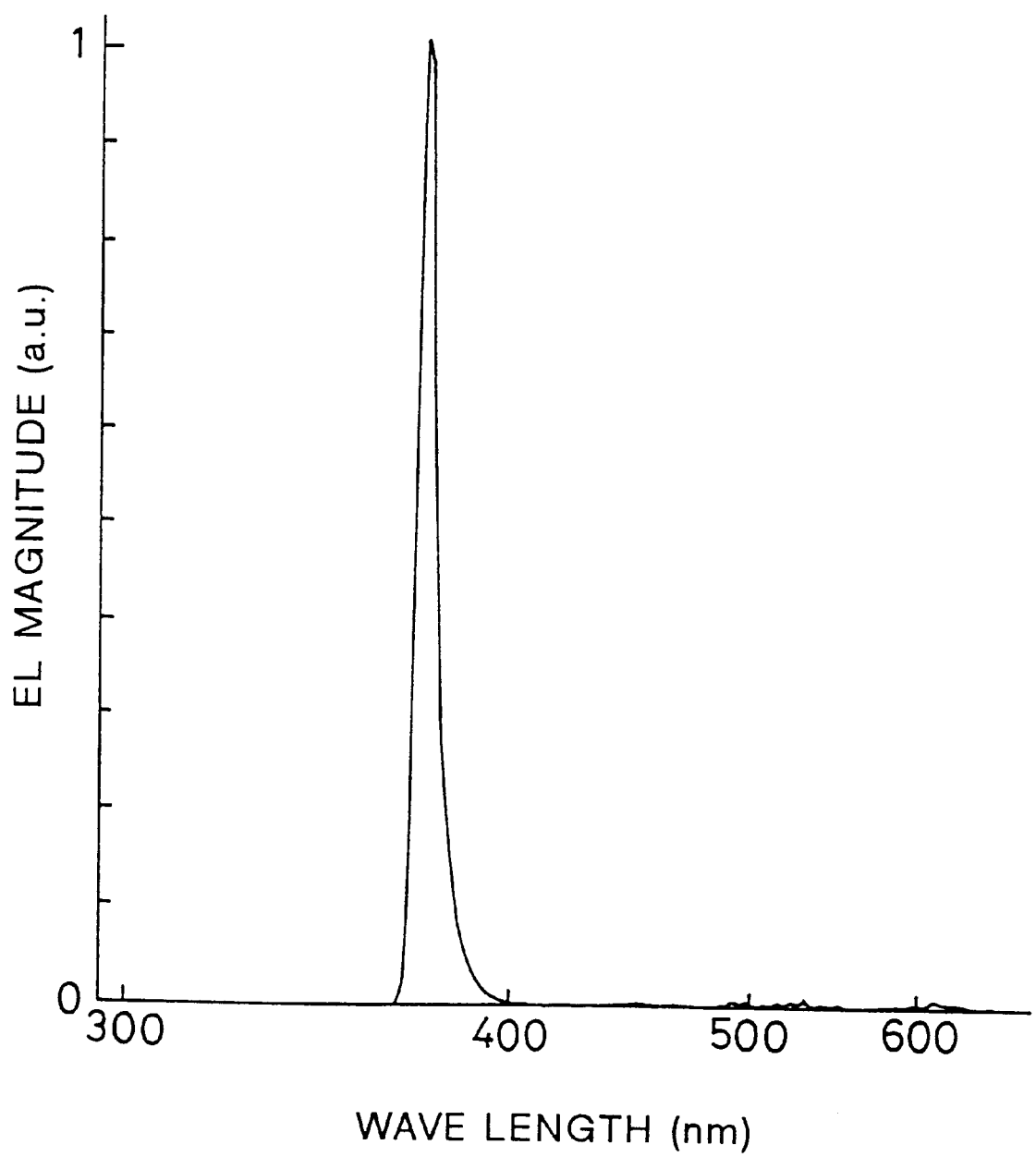
FIG. 3 is a graph indicating an emission spectrum of the EL element according to the present invention.

FIG. 3 shows the measured emission spectrum. As clearly indicated in the figure, in the emission spectrum, a remarkably sharp peak exists near approximately 370 nm of wave length (about 3.32 eV of energy), which directly reflects the excitor structure of PDHS. The width of the peak portion is approximately 20 nm. When the emission spectrum of the EL element 10 was measured under the same conditions as above, except that the ambient temperature was set at room temperature, a broader emission spectrum was observed. This is estimated that polysilane changes its conformations in many ways at room temperature.

Oligo silane or polysilane with different chain lengths were prepared. EL elements were produced by the method described above using the oligo silane or polysilane as emission layers. Then, each of the EL elements produced was cooled at 77 K and the same measurements as the above were carried out. Oligo silane with five or less silica atoms provided considerably weak emissions, so that the emission spectrum thereof could not be measured. In oligo silane with six silica atoms, emission was detected at a wave length of approximately 280 nm. The peak wave length of emission was shifted on long wave length side as the chain length becomes longer. In polysilane, the peak wave length of emission could be shifted to 380 nm to 400 nm by lengthening the chain length. In case the peak wave length of emission was shifted, a sharp emission spectrum with approximately 20 nm of peak width was observed.

Figure 4:
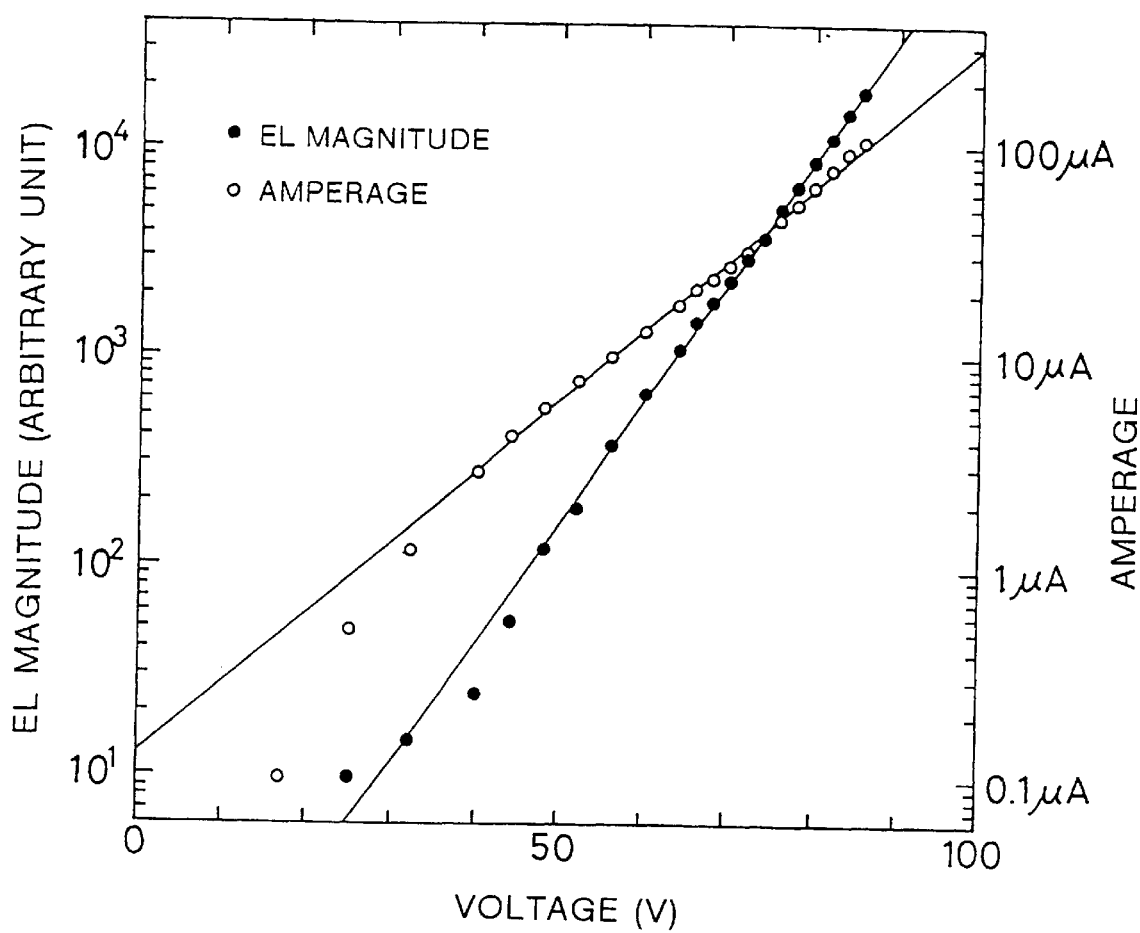
FIG. 4 is a graph indicating the transitions of applied voltage to the EL element, emission magnitude, and electric current flowing in the EL element.

FIG. 4 shows the transitions of EL emission magnitude and electrical current flowing in the EL element which vary with applied voltage. The emission magnitude and the electrical current were measured, while a changing voltage applied to the EL element 10 through DC power source 21. In the graph in FIG. 4, black dots indicate the EL emission magnitude, and white dots the electrical current flowing in the EL element.

Here, a polysilane thin film used as an emission layer was formed by the spin coating method. However, the film may be formed by optical CVD method or thermal CVD method also.

Figure 5:
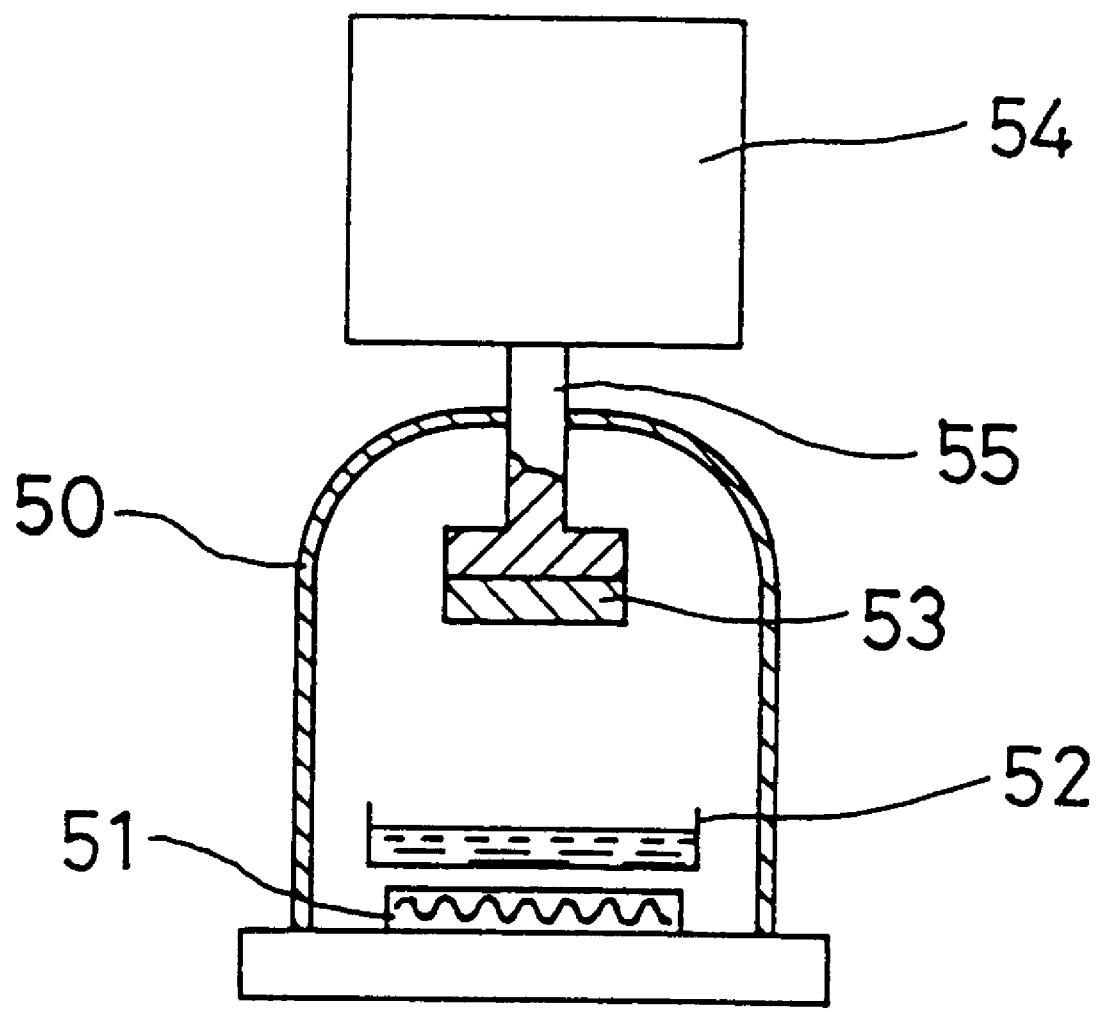
FIG. 5 explains the formation of a film through vacuum evaporation method.

FIG. 5 is a schematic view showing a method of forming a film through vacuum evaporation. A sample tray 52 is mounted on a heater 51 at the lower portion of the bell jar 50. Above the sample tray 52 is disposed a silica glass base plate 53 on which a transparent electrode, such as ITO, is coated so that the transparent electrode side is directed downwards. The silica glass base plate 53 has been cooled from the back face side through a cold finger 55 which extends from the liquid nitrogen vessel 54. As a sample, for example, polysilane, shown in chemical formula 6, is fed to the sample tray 52, and the inside of the bell jar 50 is vacuumed to be approximately $10^{-6}$ Torr. The sample is heated to about 100° C. to 120° C. through the energized heater 51 disposed below the sample tray 52. After the sample is evaporated and a thin film is formed on the transparent electrode of the silica glass base plate 53, the vacuum is released to remove the silica glass base plate 53 from the bell jar 50. Then, the evaporation of aluminum on the thin film causes the upper electrode to be formed with an EL element. In the chemical formula 6, Me represents methyl group.

[Chemical formula 6]

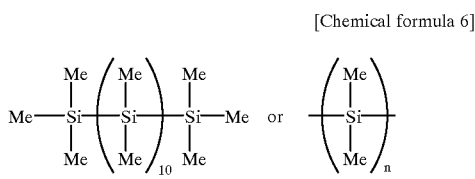

Figure 6:
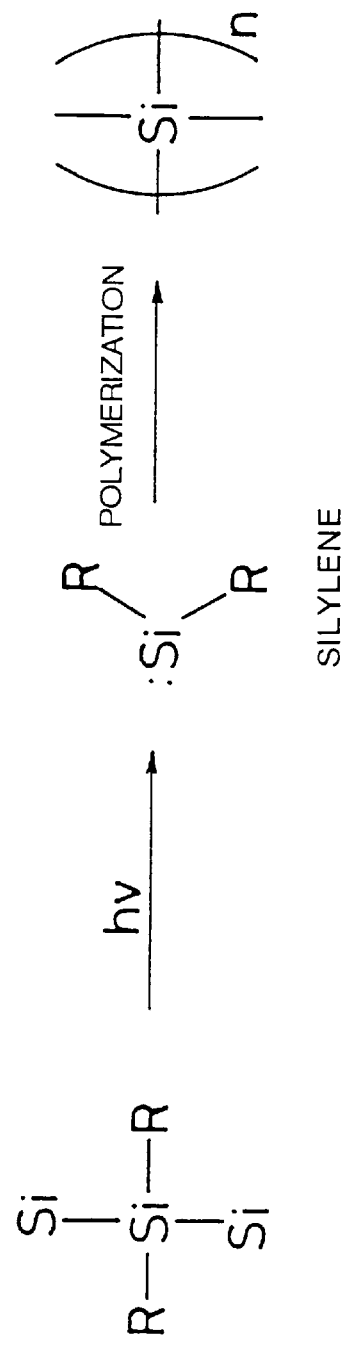
FIG. 6 explains the formation of a film through optical CVD or thermal CVD.
Figure 6:
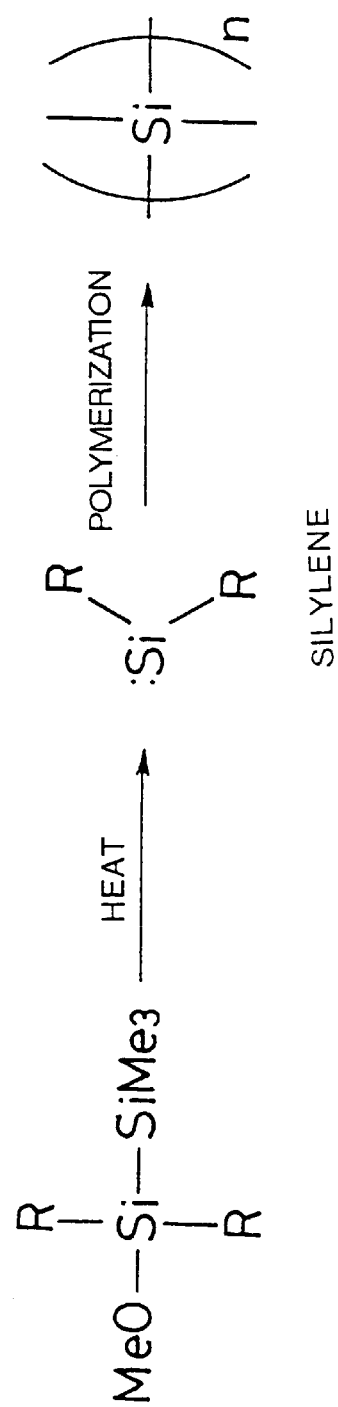

The formation of a polysilane emitting layer film can also be performed by an optical CVD method or a thermal CVD method. In such a case, as schematically illustrated in FIG. 6, polymerically-active reaction-intermediate silylene is produced through light and heat from a tri-silane derivative or a methoxydisilane derivative. On the base plate on which a transparent electrode, such as ITO is coated, the polymerization of silylene is carried out to form a thin film of polysilane on the transparent electrode. In FIG. 6, Me represents methyl group, and R represents substituents such as alkyl group and arkl group.

When forming polysilane through the CVD method, it is possible to use a silica glass base plate in which the surface is treated in the following manner. At first, a silica glass base plate is immersed in acetone and is cleaned through an ultrasonic wave. Then the base plate is immersed in nitric acid solution for ultrasonic wave cleaning. Next, the cleaned base plate is immersed in a saturated baking soda solution for ultrasonic wave cleaning. Then, in a 5-percent tri-ethoxysilane ethanole solution, the base plate is boiled for 60 minutes. Then, the base plate is put into an oven to be dried at 120° C. On the base plate treated as described above, the above-mentioned optical CVD or thermal CVD method is applied to form polysilane thin firm thereon.

Figure 7A:
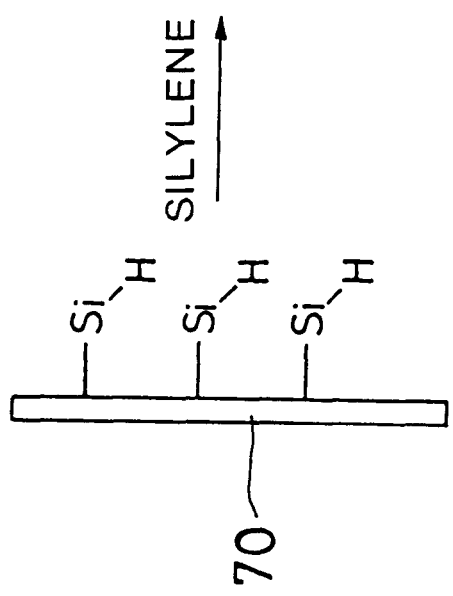
FIGS. 7(a)–7(c) explain the effect of base plate surface treatment.
Figure 7B:
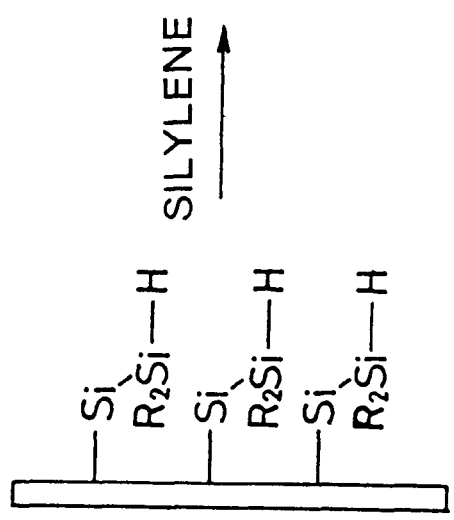
Figure 7C:
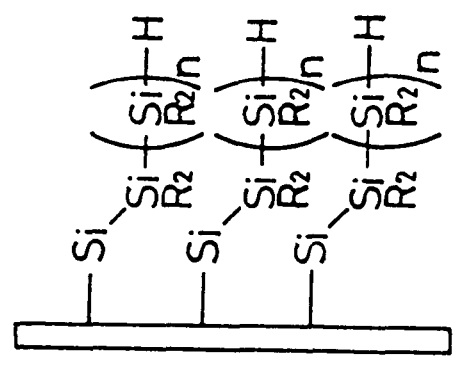

The surface treatment to the silica glass base plate increases the degree of polymerization of polysilane and trims the orientation of the polysilane, since as illustrated in FIG. 7(a), the cleaned silica glass base plate is boiled in tri-ethoxysilane solution to bond tri-ethoxysilane on the surface of the silica glass base plate 70. As illustrated in FIG. 7(b), silylene is inserted into Si—H; and as indicated in FIG. 7(c), the reaction proceeds while the insertion of silylene into Si—H is repeatedly performed. In FIGS. 7(a)–7(c), R represents substituents such as alkyl group and aryl group.

Figure 8:
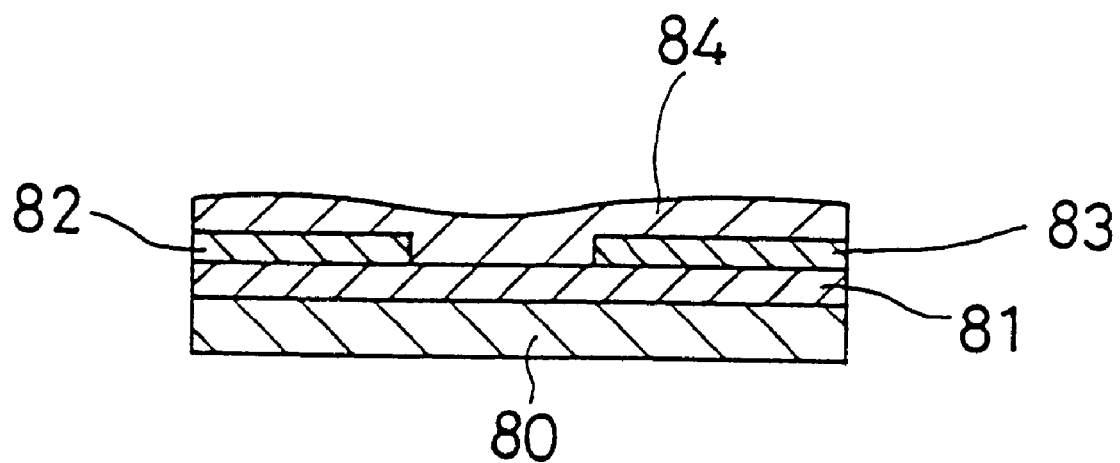
FIG. 8 is a cross-sectional view of another EL element according to the present invention.

After a polysilane thin film used as an emission layer 81 is directly formed on the silica glass base plate 80 of which surface is treated, as illustrated in FIG. 8, two aluminum electrodes 82, 83 are formed at an interval on the polysilane thin film through evaporation. A further protection film 84 may be formed thereon to produce EL element.

Figure 9:
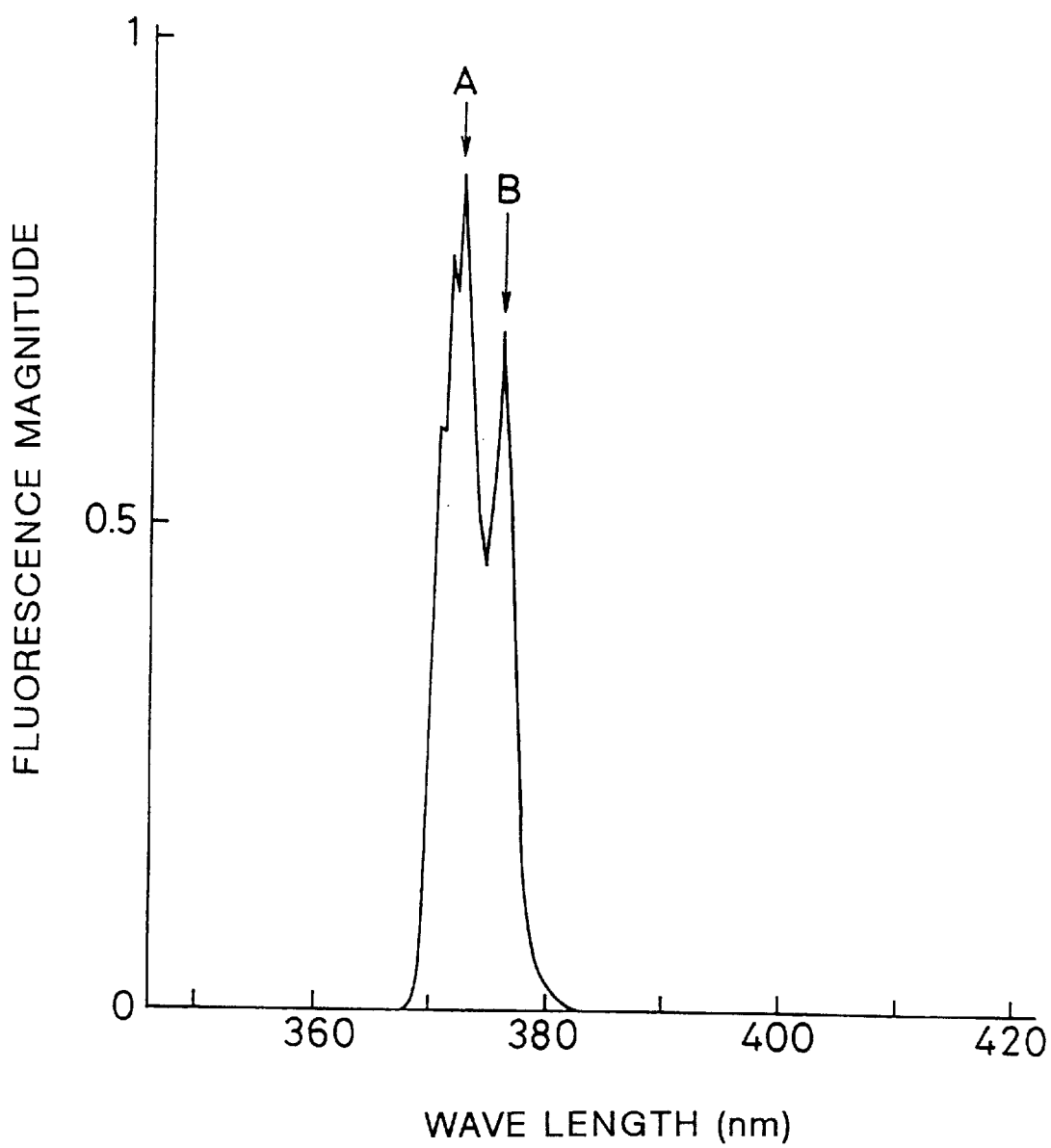
FIG. 9 is a graph indicating time-resolved fluorescent spectrum of PDHS.

Next, the thin film of poly-di-n-hexyl polysilylene (PDHS), which was formed on the silica glass base plate, is radiated by a pulse laser with 310 nm of wave length, that was double wave of pigment laser and 3 ps of pulse width to measure the fluorescent spectrum emitted from the PDHS. FIG. 9 shows a fluorescent spectrum obtained by accumulating a time-resolved fluorescent spectrum from the time immediately after radiation by the pulse laser to the time 5 ns has passed since radiation. The spectrum has two peaks at 372 nm and 376 nm of wave lengths. The peak indicated by the arrow mark A is normal fluorescence. Another peak indicated by the arrow mark B is not observed in the excitation by continuous beam with 310 nm of wave length. As described above, the fact that a specific phonon side band grows through high-density optical excitation by a pulse laser implies a possibility of laser oscillation of PDHS. Therefore, EL element according to the present invention may laser-oscillates through electrical high-density pulse excitation.

Here, the explanation provided relates to when a thin film of polymer or oligomer to which Si element is directly bonded is adopted as an emission layer of EL element. However, the emission layer used for the EL element according to the present invention is not limited to the thin film of polymer or oligomer to which an Si element is directly bonded, but, as explained with reference to chemical formulas 1 to 5, a thin film made from a polymer or oligomer in which elements selected from Si, Ge, Sn, and Pb, selected element are different from each other and are directly bonded, may be used in the same manner as described above and provide the same effects as described above.

Next, an example of laser luminescent element according to the present invention will be explained below.

A laser luminescent element with an emission layer of poly-di-methyl silylene (PDMS:—SiRR'—:R=R'=CH$_3$) was produced. A schematic cross section is illustrated in FIG. 1. The element was produced by the following method.

4.5 g of sodium was solved in 50 ml of n-octane which was treated by sulfuric acid and was deaerated. To the solution was dropped 50 ml, that is, 10 g of raw material dimethyl dichlorosilane (n-octane solution). The solution was stirred at 100° C. all night. After the completion of the reaction, ethanole was added and water were added to the solution. After the extraction with ether and the removal of solvent, polymethyl silylene was produced.

The polymethyl silylene, produced by the above steps, and the silica glass base plate 11, on which ITO electrode 12 was coated, were disposed in a vacuum evaporation device, illustrated in FIG. 5. The polymethyl silylene was heated under $10^{-5}$ Torr and at approximately 200° C. to form an evaporation film on the transparent electrode 12 coating of the silica glass base plate 11 as the emitting layer 13. The thickness of the PDMS evaporation film formed was about 100 nm. The evaporation film was confirmed to be a film of which orientation was highly controlled from polarizing property at light absorption measurement. Further, 50 nm to 100 nm of aluminum as the upper electrode 14 was evaporated on the evaporation film to produce the EL element 10.

Figure 2:
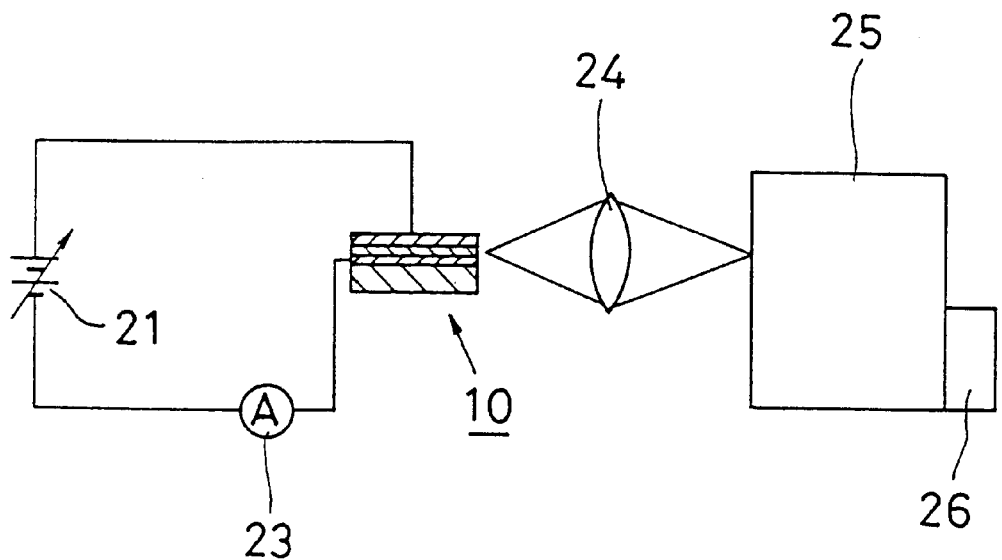
FIG. 2 explains an emission spectrum measuring system.

The laser luminescent element produced was connected to a DC power source 21, as illustrated in FIG. 2, and approximately 50V of voltage was applied at room temperature to cause the laser luminescent element to emit. The beam generated from the laser luminescent element was introduced to a spectrometer to measure emission spectrum thereof. As a result, many sharp peaks were observed.

Figure 10:
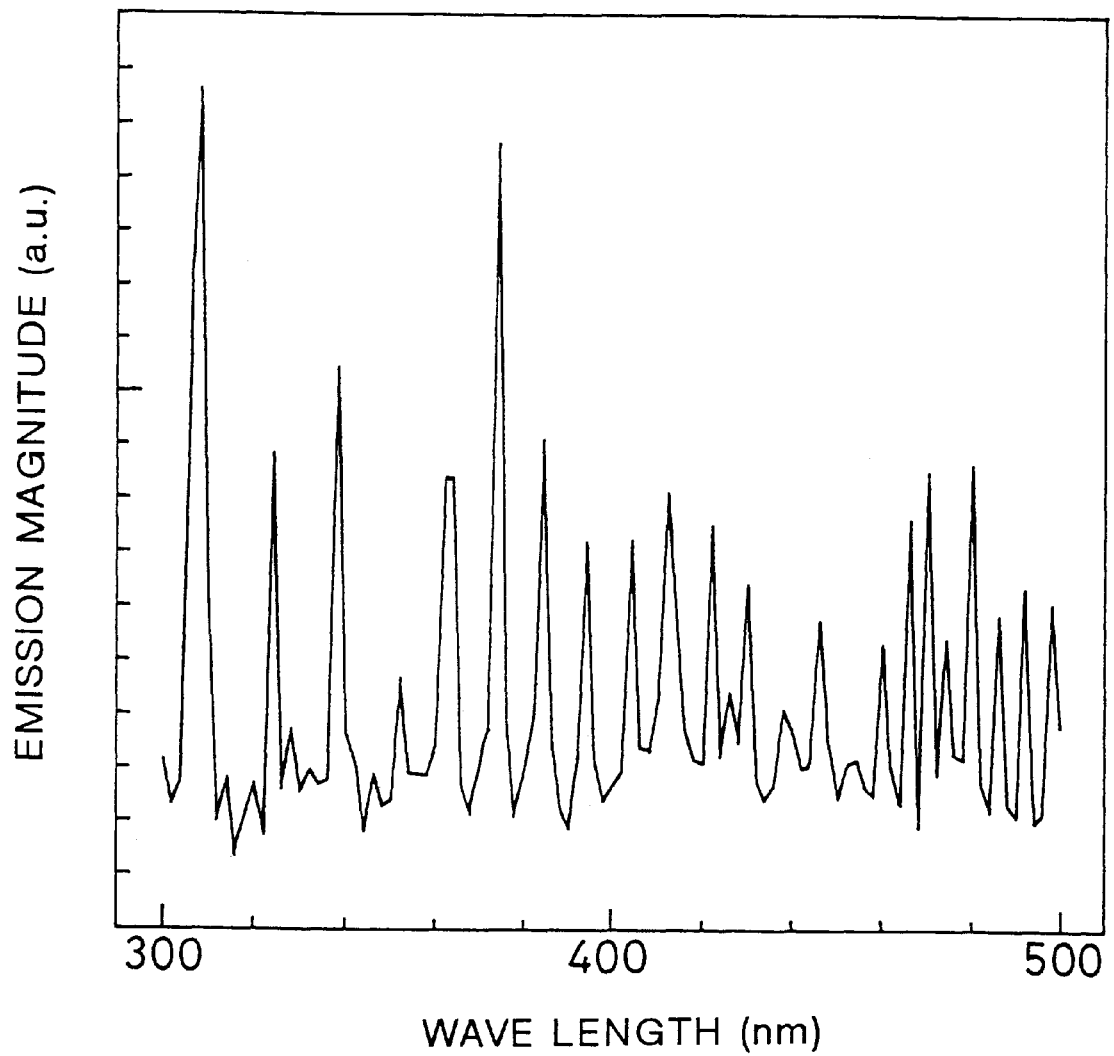
FIG. 10 is a graph indicating emission spectrum of a laser luminescent element according to the present invention.
Figure 11:
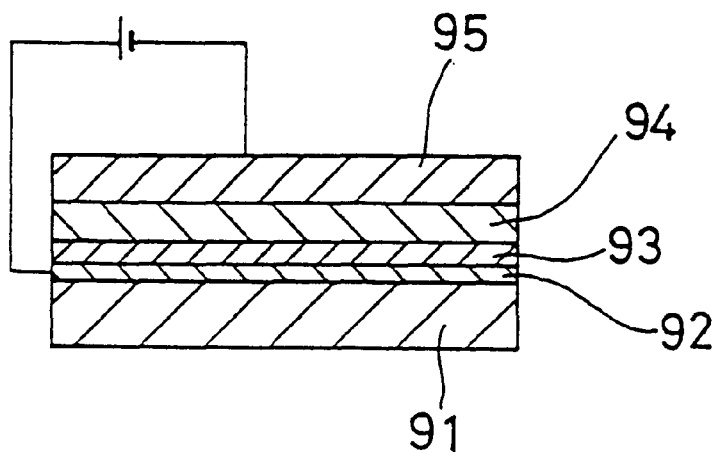
FIG. 11 is a schematic cross-sectional view of a conventional two-layer EL element.

FIG. 10 shows the measured emission spectrum. As clearly indicated in FIG. 10, different from normal emission, a progression with sharp peaks based on the laser oscillation was observed. The wave length of the oscillation is changeable in accordance with the structure of molecule. Here, the explanation was made about the laser oscillation with PDMS evaporation film. However, other oligosilane or polysilane may be used to perform laser oscillation by trimming the orientation of the molecule.

With the present invention, an EL element with a high purity emission spectrum in an ultraviolet range can be obtained. Further, with considerably simple solid structure, a laser luminescent element with an oscillation line in the ultraviolet range can be obtained.

What is claimed is:

1. An ultraviolet electroluminescent element, said element comprising:

two electrodes having a thin film disposed between said two electrodes; and said thin film being made from one of a polymer and an oligomer of elements selected from Si, Ge, Sn, and Pb, said elements being directly bonded, said thin film being a luminous layer having an emission peak only within the ultraviolet range of 400 nm or less, said polymer or oligomer being represented by a formula selected from the group consisting of formulae 1–5:

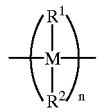

Formula 1 wherein M represents Si, Ge, Sn, or Pb, and $R^1$ and $R^2$ independently represent an alkyl, allyl, phenoxy, alkoxyl, alkylamino, alkylthio, or alcoholic hydoxy group;

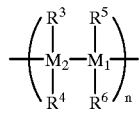

Formula 2 wherein $M_1$ and $M_2$ represent Si, Ge, Sn, or Pb, and $R^3$, $R^4$, $R^5$ and $R^6$ independently represent an alkyl, allyl, phenoxy, alkoxyl, alkylamino, alkylthio, or alcoholic hydoxy group:

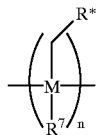

Formula 3 wherein M represents Si, Ge, Sn, or Pb, R* represents an optically active substituent and $R^7$ represents an alkyl, allyl, phenoxy, alkoxyl, alkylamino, alkylthio, or alcoholic hydoxy group;

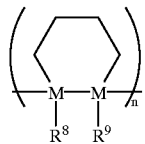

Formula 4 wherein M represents Si, Ge, Sn, or Pb, and $R^8$ and $R^9$ independently represent an alkyl, allyl, phenoxy, alkoxyl, alkylamino, alkylthio, or alcoholic hydoxy group;

Formula 5 wherein M represents Si, Ge, Sn, or Pb, and R represents an alkyl, allyl, phenoxy, alkoxyl, alkylamino, alkylthio, or alcoholic hydoxy group;

wherein at least one of said electrodes is transparent.

2. The ultraviolet electroluminescent element as claimed in claim 1, wherein one of said polymer and said oligomer is structurally controlled.

3. The ultraviolet electroluminescent element as claimed in claim 1, wherein said thin film is formed by one method selected from spin coating, vacuum evaporation, and CVD.

4. The ultraviolet electroluminescent element as claimed in claim 2, wherein said thin film is formed by one method selected from spin coating, vacuum evaporation, and CVD.

5. The ultraviolet electroluminescent element as claimed in claim 1 wherein said thin film is formed by a method selected from the group consisting of spin coating, vacuum evaporation, and CVD.

6. An ultraviolet electroluminescent element, said element comprising:
  two electrodes, said electrodes being disposed on a thin film; and
  said thin film made from one of a polymer and an oligomer of elements selected from Si, Ge, Sn, and Pb, said elements being directly bonded, said thin film being formed on a silane-treated silica glass base plate through CVD method, wherein at least one of said electrodes is transparent.

* * * * *